(12) United States Patent
Hong

(10) Patent No.: US 12,334,144 B2
(45) Date of Patent: Jun. 17, 2025

(54) MEMORY DEVICE INCLUDING BOOSTER CIRCUIT FOR TRACKING WORD LINE

(71) Applicant: Taiwan Semiconductor Manufacturing Company, Ltd., Hsinchu (TW)

(72) Inventor: Hyunsung Hong, Kanata (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 252 days.

(21) Appl. No.: 17/890,693

(22) Filed: Aug. 18, 2022

(65) Prior Publication Data
US 2023/0377638 A1 Nov. 23, 2023

Related U.S. Application Data

(60) Provisional application No. 63/344,367, filed on May 20, 2022.

(51) Int. Cl.
*G11C 11/418* (2006.01)
(52) U.S. Cl.
CPC .................................. *G11C 11/418* (2013.01)
(58) Field of Classification Search
CPC .................................................... G11C 11/418
See application file for complete search history.

(56) References Cited

U.S. PATENT DOCUMENTS

| 5,706,233 A * | 1/1998 | Ooishi ................. G11C 29/006 365/201 |
| 5,751,643 A * | 5/1998 | Lines ...................... G11C 8/08 365/189.11 |
| 11,114,148 B1 * | 9/2021 | Pan ...................... G11C 11/2257 |
| 2002/0145906 A1 * | 10/2002 | Einaga ..................... G11C 8/18 365/185.2 |
| 2002/0176273 A1 * | 11/2002 | Kang ..................... G11C 5/145 365/145 |
| 2004/0042250 A1 * | 3/2004 | Kang ..................... G11C 11/22 365/145 |
| 2012/0170390 A1 * | 7/2012 | Idgunji ................ G11C 11/413 365/194 |
| 2013/0088926 A1 * | 4/2013 | Tao .......................... G11C 7/10 365/191 |

(Continued)

FOREIGN PATENT DOCUMENTS

TW 202008562 A 2/2020

*Primary Examiner* — Douglas King
(74) *Attorney, Agent, or Firm* — FOLEY & LARDNER LLP

(57) ABSTRACT

Disclosed herein are related to a memory device. In one aspect, the memory device includes a set of memory cells coupled to a word line, and a tracking cell coupled to a tracking word line and a tracking bit line. In one aspect, the memory device includes a tracking booster circuit coupled to the tracking word line. In one aspect, the tracking booster circuit is configured to boost a first edge of a first pulse applied to the tracking word line. In one aspect, the tracking cell is configured to generate a second pulse at the tracking bit line, in response to the first pulse having the boosted first edge. In one aspect, the memory device includes a word line controller configured to apply a third pulse to the word line, based on the second pulse.

20 Claims, 12 Drawing Sheets

(56) References Cited

U.S. PATENT DOCUMENTS

| | | | |
|---|---|---|---|
| 2013/0182505 A1* | 7/2013 | Liu | G11C 16/10 365/185.17 |
| 2013/0329505 A1* | 12/2013 | Yang | G11C 7/227 365/189.11 |
| 2014/0269141 A1* | 9/2014 | Hsu | G11C 7/06 365/230.06 |
| 2015/0078110 A1* | 3/2015 | Hong | G11C 7/08 365/194 |
| 2016/0284387 A1* | 9/2016 | Chen | G11C 8/08 |
| 2017/0110183 A1 | 4/2017 | Chung et al. | |
| 2021/0391001 A1 | 12/2021 | Park et al. | |
| 2022/0068372 A1* | 3/2022 | Hsieh | G11C 11/419 |
| 2023/0064595 A1* | 3/2023 | Huang | G11C 8/18 |

\* cited by examiner

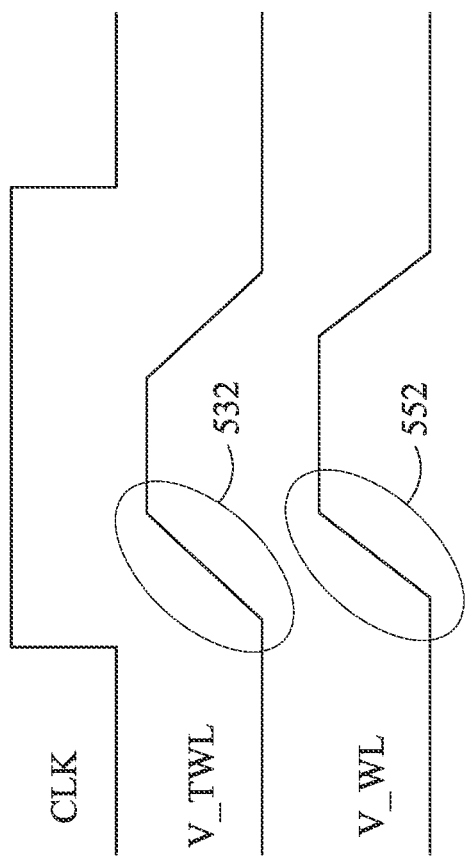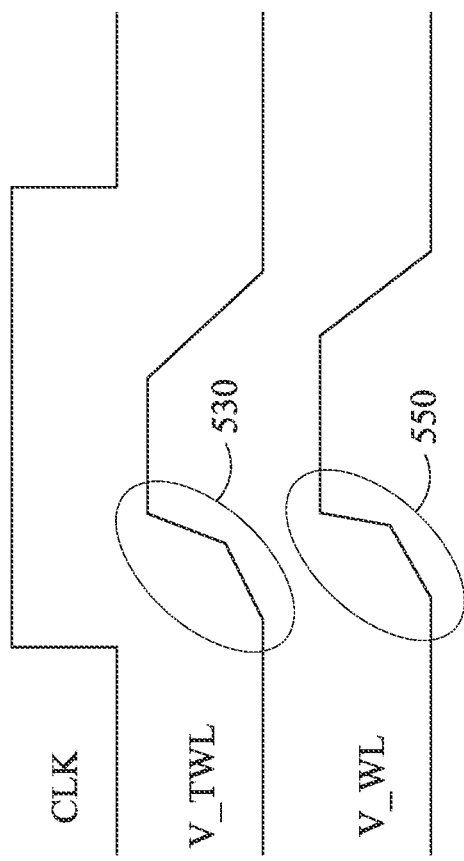

MEMORY DEVICE INCLUDING BOOSTER CIRCUIT FOR TRACKING WORD LINE

CROSS-REFERENCE TO RELATED APPLICATION

This application claims priority to and the benefit of U.S. Provisional Patent Application No. 63/344,367, filed on May 20, 2022, which is incorporated by reference in its entirety.

BACKGROUND

Developments in electronic devices, such as computers, portable devices, smart phones, internet of thing (IoT) devices, etc., have prompted increased demands for memory devices. In general, memory devices may be volatile memory devices or non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A illustrates an example timing diagram showing waveforms of pulses of a memory device when boosting for a word line and a tracking word line is disabled, in accordance with some embodiments.

FIG. 6B illustrates an example timing diagram showing waveforms of pulses of a memory device when boosting for a word line and a tracking word line is enabled, in accordance with some embodiments.

DETAILED DESCRIPTION

Figure 1:
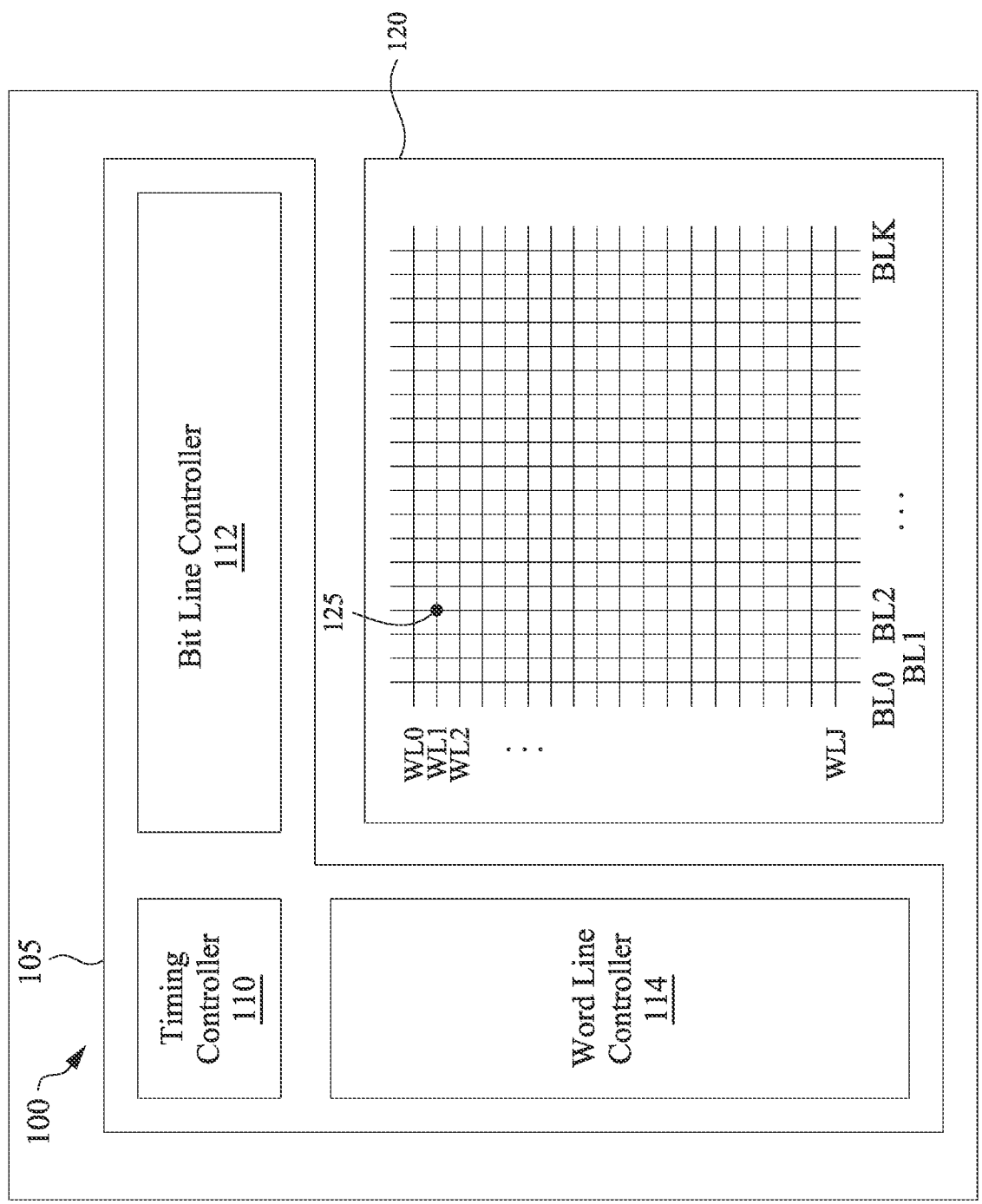
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a memory device with boosting for a tracking word line. In one aspect, the memory device includes a set of memory cells coupled to a word line, and a tracking cell coupled to a tracking word line and a tracking bit line. A tracking cell may be a dummy memory cell or a replicate of a memory cell to simulate a timing behavior of the memory cell. A tracking cell may not store data. In one aspect, the memory device includes a tracking booster circuit coupled to the tracking word line. In one aspect, the tracking booster circuit is configured to boost a first edge of a first pulse applied to the tracking word line. Boosting an edge of a pulse herein refers to speeding up a transition of states in the pulse from one state to another state, such that the pulse can have a faster or a sharper edge. In one aspect, the tracking cell is configured to generate a second pulse at the tracking bit line, in response to the first pulse having the boosted first edge. In one aspect, the memory device includes a word line controller configured to apply a third pulse to the word line, based on the second pulse received through the tracking bit line.

Advantageously, the disclosed memory device with a tracking booster circuit can achieve improved performances. In one aspect, a pulse applied to a word line of a set of memory cells can be generated, according to a timing response of a tracking cell (or a set of tracking cells having a fewer number of memory cells than the set of memory cells). Because the set of memory cells may have a large number of memory cells (e.g., over hundreds or thousands) than the set of tracking cells, the word line of the set of memory cells may have a large capacitive loading or a large parasitic capacitance. Such large capacitive loading or parasitic capacitance may degrade an edge of a pulse. For example, a time for a transition from one state (e.g., logic value '0' or 0V) to another state (e.g., logic value '1' or 1V) of the pulse may be extended due to the large capacitive loading or a large parasitic capacitance. To improve the edge of a pulse applied to the word line (or reduce the time for the transition from one state to another state), a booster circuit can be implemented. For example, a booster circuit may speed up a transition of states in the pulse applied to the word line from one state to another state, such that the pulse can have a faster or a sharper edge. However, when boosting is performed for the word line but not for the tracking word line, a tracking cell coupled to the tracking word line may not simulate or replicate a behavior or characteristic of a set of memory cells coupled to the word line well. By implementing a tracking booster circuit to boost an edge of a pulse at a tracking word line coupled to a tracking cell, the tracking cell can better simulate or predict a behavior or characteristic of a set of memory cells coupled to a word line. Moreover, an edge (e.g., falling edge) of a pulse applied to the word line may be generated based on an edge (e.g., a rising edge) of a pulse applied to the tracking word line. By improving or boosting the edge of the pulse applied to the tracking word line, the edge (e.g., falling edge) of the pulse applied to the word line can occur faster, such that the pulse applied to the word line can have a narrower pulse width. By reducing a pulse width of the pulse applied to the word line, an operating speed of the memory device can be improved.

In some embodiments, one or more components can be embodied as one or more transistors. The transistors in this disclosure are shown to have a certain type (N-type or P-type), but embodiments are not limited thereto. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode and a drain electrode can be each referred to as a source/drain electrode herein.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one configuration, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell, a dynamic random access memory (DRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. In some embodiments, the timing controller 110 is embodied as or includes a processor and a non-transitory computer readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112 and the word line controller 114. In one approach, to write data to a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

Figure 2:
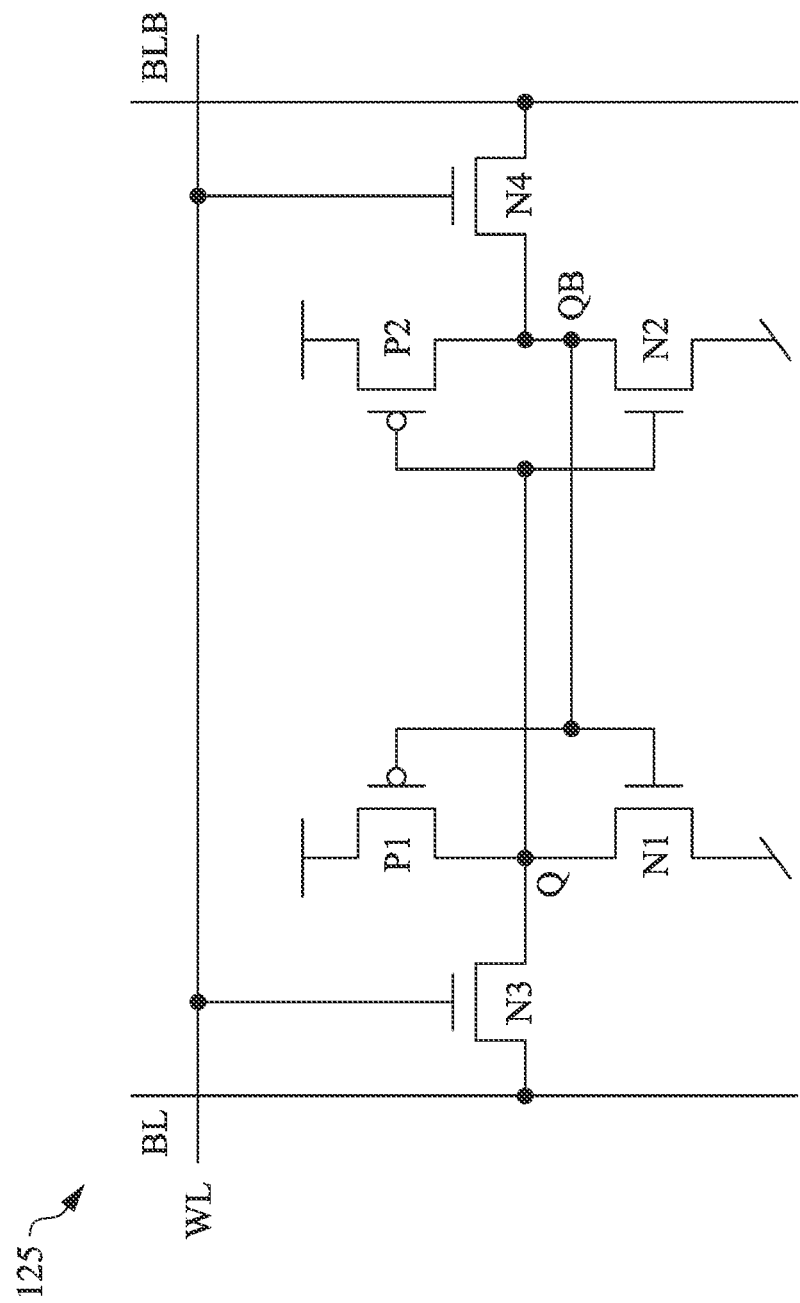
FIG. 2 is a diagram of a static random access memory (SRAM) cell, in accordance with one embodiment.

FIG. 2 is a diagram of a SRAM cell 125, in accordance with one embodiment. In some embodiments, the SRAM cell 125 includes N-type transistors N1, N2, N3, N4 and P-type transistors P1, P2. The N-type transistors N1, N2, N3, N4 may be N-type metal-oxide-semiconductor field-effect transistors (MOSFET) or N-type fin field-effect transistors (FinFET). The P-type transistors P1, P2 may be P-type MOSFET or P-type FinFET. These components may operate together to store a bit. In other embodiments, the SRAM cell 125 includes more, fewer, or different components than shown in FIG. 2.

In one configuration, the N-type transistors N3, N4 include gate electrodes coupled to a word line WL. In one configuration, a drain electrode of the N-type transistor N3 is coupled to a bit line BL, and a source electrode of the N-type transistor N3 is coupled to a port Q. In one configuration, a drain electrode of the N-type transistor N4 is coupled to a bit line BLB, and a source electrode of the N-type transistor N4 is coupled to a port QB. In one aspect, the N-type transistors N3, N4 operate as electrical switches. The N-type transistors N3, N4 may allow the bit line BL to electrically couple to or decouple from the port Q and allow the bit line BLB to electrically couple to or decouple from the port QB, according to a voltage applied to the word line WL. For example, according to a supply voltage VDD (or 1V) corresponding to a high state (or logic value '1') applied to the word line WL, the N-type transistor N3 is enabled to electrically couple the bit line BL to the port Q and the N-type transistor N4 is enabled to electrically couple the bit line BLB to the port QB. For another example, according to a ground voltage GND (or 0V) corresponding to a low state (or logic value '0') applied to the word line WL, the N-type transistor N3 is disabled to electrically decouple the bit line BL from the port Q and the N-type transistor N4 is disabled to electrically decouple the bit line BLB from the port QB.

In one configuration, the N-type transistor N1 includes a source electrode coupled to a first supply voltage rail supplying the ground voltage GND, a gate electrode coupled to the port QB, and a drain electrode coupled to the port Q. In one configuration, the P-type transistor P1 includes a source electrode coupled to a second supply voltage rail supplying the supply voltage VDD, a gate electrode coupled to the port QB, and a drain electrode coupled to the port Q. In one configuration, the N-type transistor N2 includes a source electrode coupled to the first supply voltage rail supplying the ground voltage GND, a gate electrode coupled to the port Q, and a drain electrode coupled to the port QB. In one configuration, the P-type transistor P2 includes a source electrode coupled to the second supply voltage rail supplying the supply voltage VDD, a gate electrode coupled to the port Q, and a drain electrode coupled to the port QB. In this configuration, the N-type transistor N1 and the P-type transistor P1 operate as an inverter, and the N-type transistor N2 and the P-type transistor P2 operate as an inverter, such that two inverters form cross-coupled inverters. In one aspect, the cross-coupled inverters may sense and amplify a difference in voltages at the ports Q, QB. When writing data, the cross-coupled inverters may sense voltages at the ports Q, QB provided through the N-type transistors N3, N4 and amplify a difference in voltages at the bit lines BL, BLB. For example, the cross-coupled inverters sense a voltage 0.5 V at the port Q and a voltage 0.4V at the port QB, and amplify a difference in the voltages at the ports Q, QB through a positive feedback (or a regenerative feedback) such that the voltage at the port Q becomes the supply voltage VDD (e.g., 1V) and the voltage at the port QB becomes the ground voltage GND (e.g. 0V). The amplified voltages at the ports Q, QB may be provided to the bit lines BL, BLB through the N-type transistors N3, N4, respectively for reading.

Figure 3:
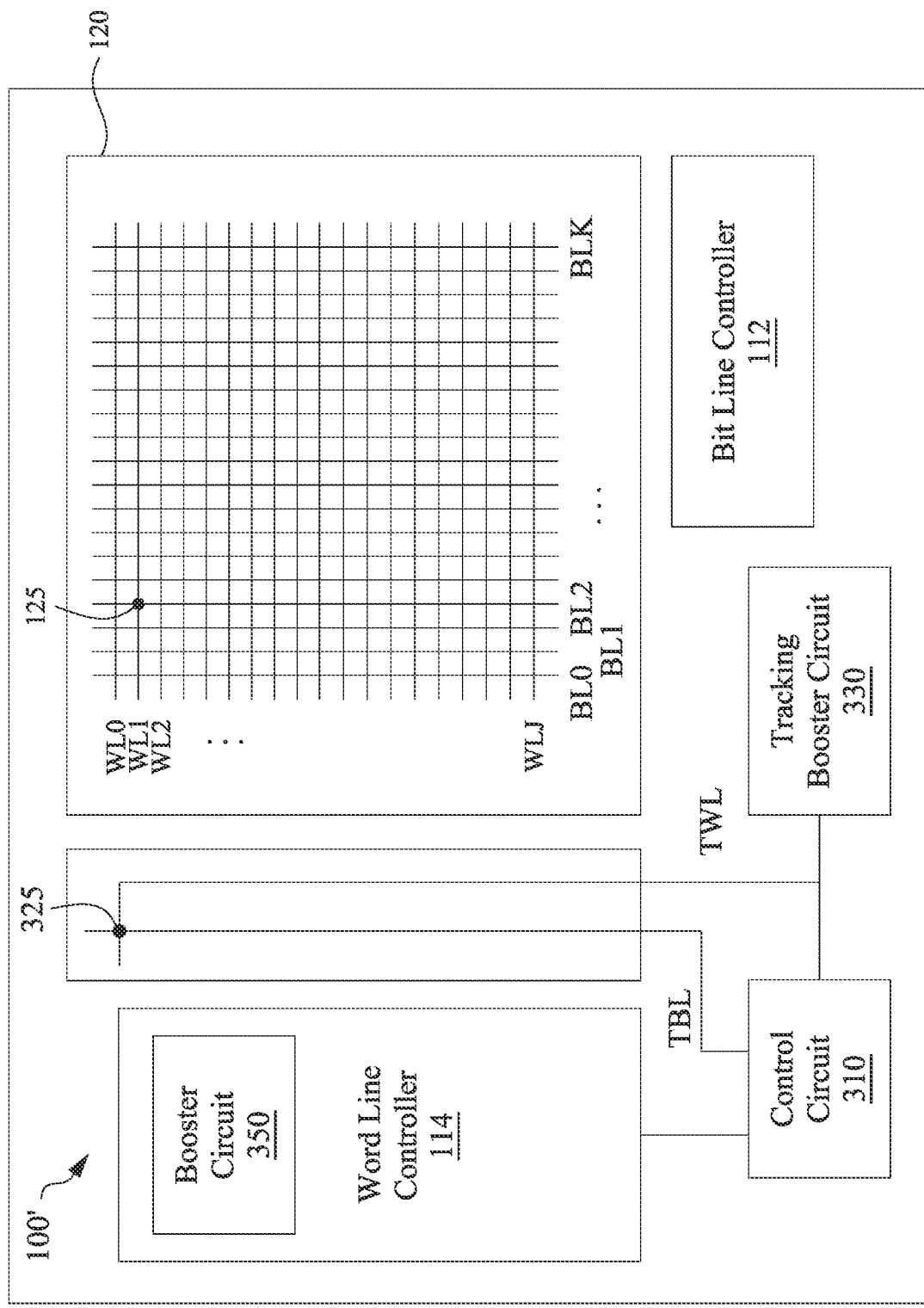
FIG. 3 illustrates a schematic block diagram of an example memory device including a set of tracking cells and a tracking booster circuit for the set of tracking cells, in accordance with some embodiments.

FIG. 3 illustrates a schematic block diagram of an example memory device 100' including a set of tracking cells 325 and a tracking booster circuit 330 for the set of tracking cells 325, in accordance with some embodiments. In some embodiments, the memory device 100' shown in FIG. 3 is similar to the memory device 100 shown in FIG. 1, except that the memory device 100' includes a control circuit 310, the set of tracking cells 325, and the tracking booster circuit 330, and that the word line controller 114 includes a booster circuit 350. Thus, detailed description of duplicated portion thereof is omitted herein for the sake of brevity.

In some embodiments, a tracking cell 325 is a circuit or a component that simulates or replicates a behavior or a characteristic of memory cells 125. Each tracking cell 325 may be a dummy memory cell or a memory cell that does not store data. Each tracking cell 325 may have a same structure or a same configuration as a memory cell 125. In some embodiments, the set of tracking cells 325 may be disposed along the Y-direction, and may be disposed between the word line controller 114 and the memory array 120. The set of tracking cells 325 may have a fewer number of cells than the memory cells 125. In some embodiments, the set of tracking cells 325 is formed as part of the memory array 120 as a subset of the set of memory cells 125. In some embodiments, the set of tracking cells 325 and the set of memory cells 125 are formed separately. In one configuration, at least one of the set of tracking cells 325 is coupled to a tracking word line TWL. A tracking word line TWL may be a metal rail to provide a pulse from the tracking booster circuit 330 to the at least one of the set of tracking cells 325. In response to the pulse provided through the tracking word line TWL, the at least one of the set of tracking cells 325 may generate another pulse. In one configuration, each tracking cell 325 is coupled to a tracking bit line TBL. A tracking bit line TBL may be a metal rail to provide a pulse from the set of tracking cells 325 to the control circuit 310. In this configuration, the set of tracking cells 325 can simulate or predict a behavior or a characteristic of memory cells 125. For example, a tracking cell 325 can receive a pulse through the tracking word line TWL and provide another pulse through the tracking bit line TBL in response to the pulse received through the tracking word line TWL. The another pulse provided by the tracking cell 325 through the tracking bit line TBL may have a certain delay with respect to the pulse received through the tracking word line TWL. Such delay can indicate a timing behavior or a timing response of the memory cells 125.

In some embodiments, the tracking booster circuit 330 is a circuit or a component that boots an edge of a pulse applied to a tracking word line TWL. Boosting an edge of a pulse herein refers to speeding up a transition of states in the pulse from one state to another state, such that the pulse can have a faster or a sharper edge. In one configuration, the tracking booster circuit 330 is coupled to the control circuit 310 and at least one of the set of tracking cells 325 through a tracking word line TWL. In this configuration, the tracking booster circuit 330 can receive a pulse from the control circuit 310 through the tracking word line TWL and adjust or modify the pulse from the control circuit 310, such that the pulse at the tracking word line TWL can have a faster or a sharper edge. In some embodiments, the tracking booster circuit 330 is implemented as part of the control circuit 310 or is disposed adjacent to the control circuit 310. In some embodiments, the tracking booster circuit 330 is implemented as part of the bit line controller 112 or is disposed adjacent to the bit line controller 112. In some embodiments, the tracking booster circuit 330 is implemented as part of the word line controller 114 or is disposed adjacent to the word line controller 114. Detailed description on example implementations of the tracking booster circuit 330 is provided below with respect to FIGS. 7-10B.

In some embodiments, the control circuit 310 is a circuit or a component that controls or configures operations of the word line controller 114 and/or the tracking booster circuit 330. In some embodiments, the control circuit 310 is implemented as part of the timing controller 110. In some embodiments, the control circuit 310 is implemented as part of the word line controller 114 or the bit line controller 112. In some embodiments, the control circuit 310 includes one or more logic circuits. In one configuration, the control circuit 310 is coupled to a tracking word line TWL and a tracking bit line TBL. In this configuration, the control circuit may generate a pulse and applies the pulse to the tracking word line TWL. In response to the pulse applied to the tracking word line TWL (or the pulse having an edge boosted by the tracking booster circuit 330), the control circuit 310 may receive another pulse generated by the tracking cell 325 through the tracking bit line TBL. The another pulse from the tracking cell 325 may indicate a timing behavior or a timing characteristic of memory cells 125. According to the another pulse received through the tracking bit line TBL, the control circuit 310 may cause or configure the word line controller 114 to apply a pulse to a word line WL. For example, the control circuit 310 may generate a pulse based on an edge (e.g., falling edge) of the another pulse received through the tracking bit line TBL, and provide or apply the generated pulse to the word line controller 114. According to the pulse from the control circuit 310, the word line controller 114 can generate a pulse having a pulse width to ensure that the memory cells 125 can operate correctly, and apply the pulse to memory cells 125 through the word line WL.

In some embodiments, the word line controller 114 includes or is coupled to one or more booster circuits 350. Although a single booster circuit 350 is shown in FIG. 3, the word line controller 114 may include or may be coupled to additional booster circuits 350. The booster circuit 350 may boost an edge of a pulse applied to a word line WL. Because the memory array 120 may have a large number of memory cells (e.g., over hundreds or thousands), the word line WL may have a large capacitive loading or a large parasitic capacitance. Such large capacitive loading or large parasitic capacitance may degrade an edge of a pulse applied to the word line WL. For example, a time for a transition from one state (e.g., logic value '0' or 0V) to another state (e.g., logic value '1' or 1V) may be extended due to the large capacitive loading or the large parasitic capacitance. In one aspect, the booster circuit 350 can improve the edge of the pulse applied to the word line WL (or reduce the time for the transition from one state to another state). For example, the booster circuit 350 may speed up a transition of states in the pulse applied to the word line WL from one state to another state, such that the pulse can have a faster or a sharper edge.

Advantageously, the disclosed memory device 100' with the tracking booster circuit 330 can achieve improved performances. For example, when boosting is performed for the word line WL but not for the tracking word line TWL, a tracking cell 325 coupled to the tracking word line TWL may not simulate or replicate a behavior or characteristic of a set of memory cells 125 coupled to the word line WL well. By implementing the tracking booster circuit 330 to boost an edge of a pulse at the tracking word line TWL coupled to a tracking cell 325, the tracking cell 325 can better simulate or predict a timing behavior or timing characteristic of a set of memory cells 125 coupled to the word line WL. Moreover, an edge (e.g., falling edge) of a pulse applied to the word line WL may be generated based on an edge (e.g., a rising edge) of a pulse applied to the tracking word line TWL. For example, the edge (e.g., falling edge) of the pulse applied to the word line WL may occur a predetermined time or a certain time after the edge (e.g., a rising edge) of the pulse from the tracking word line TWL occurs. By improving or boosting the edge of the pulse applied to the tracking word line TWL, the edge (e.g., falling edge) of the pulse applied to the word line WL can occur faster, such that the pulse applied to the word line WL can have a narrower pulse width. By reducing a pulse width of the pulse applied to the word line WL, an operating speed of the memory device 100' can be improved.

Figure 4:
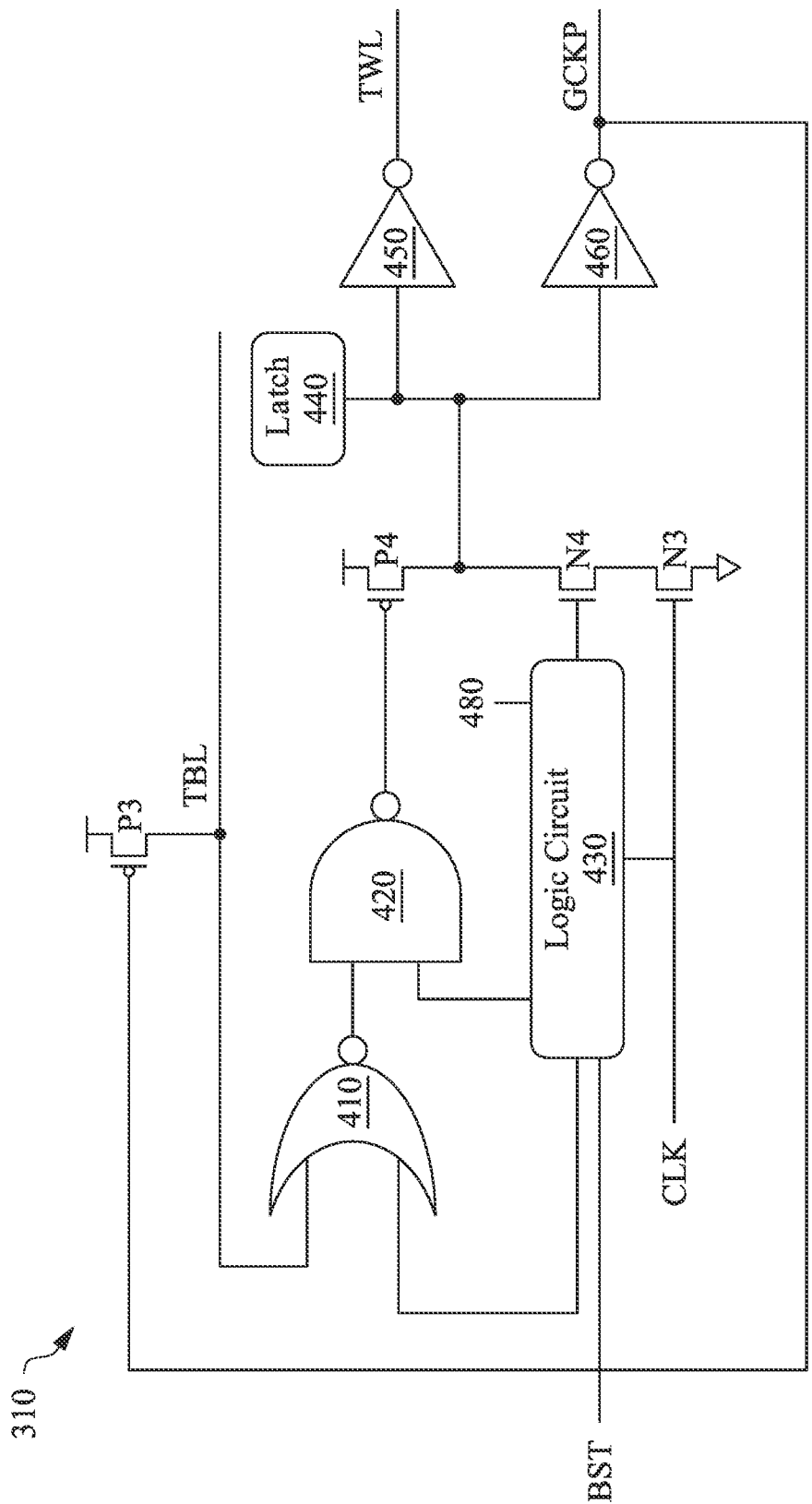
FIG. 4 illustrates a schematic block diagram of an example control circuit, in accordance with some embodiments.

FIG. 4 illustrates a schematic block diagram of an example control circuit 310, in accordance with some embodiments. In some embodiments, the control circuit 310 includes a NOR gate 410, a NAND gate 420, a logic circuit 430, transistors P3, P4, N3, N4, a latch 440, and inverters 450, 460. These components may operate together to generate signals or pulses to control or configure operations of the word line controller 114, the tracking booster circuit 330, and/or the tracking cell 325. In some embodiments, the control circuit 310 includes more, fewer, or different components than shown in FIG. 4.

In some embodiments, the NOR gate 410 is a circuit or a component that performs a NOR operation on its inputs. In some embodiments, the NOR gate 410 can be replaced by a different component that can perform the functions of the NOR gate 410 described herein. In one configuration, the NOR gate 410 includes a first input port coupled to a tracking bit line TBL, a second input port coupled to a logic circuit 430, and an output port coupled to a first input port of the NAND gate 420. In this configuration, the NOR gate 410 can perform a NOR operation on a first signal received through the tracking bit line TBL, and a second signal received from the logic circuit 430. For example, the NOR gate 410 can generate, at the output port, a voltage corresponding to a logic value '1' or supply voltage VDD, in response to both of a first signal from the tracking bit line TBL and a second signal from the logic circuit 430 having a voltage corresponding to a logic value '0' or a ground voltage GND. For example, the NOR gate 410 can generate, at the output port, a voltage corresponding to a logic value '0' or ground voltage GND, in response to at least one of i) a first signal from the tracking bit line TBL or ii) a second signal from the logic circuit 430 having a voltage corresponding to a logic value '1' or a supply voltage VDD.

In some embodiments, the NAND gate 420 is a circuit or a component that performs a NAND operation on its inputs. In some embodiments, the NAND gate 420 can be replaced by a different component that can perform the functions of the NAND gate 420 described herein. In one configuration, the NAND gate 420 includes a first input port coupled to the output port of the NOR gate 410, a second input port coupled to the logic circuit 430, and an output port coupled to a gate electrode of the transistor P4. In this configuration, the NAND gate 420 can perform a NAND operation on a first signal received from the output port of the NOR gate 410, and a second signal received from the logic circuit 430. For example, the NAND gate 420 can generate, at the output port, a voltage corresponding to a logic value '1' or supply voltage VDD, in response to at least one of i) a first signal from the output port of the NOR gate 410 or ii) a second signal from the logic circuit 430 having a voltage corresponding to a logic value '0' or a ground voltage GND. For example, the NAND gate 420 can generate, at the output port, a voltage corresponding to a logic value '0' or ground voltage GND, in response to both of a first signal from the output port of the NOR gate 410 and a second signal from the logic circuit 430 having a voltage corresponding to a logic value '1' or a supply voltage VDD.

In some embodiments, the transistors P4, N3, N4 operate together to generate a signal or a pulse to provide to the inverters 450, 460. The transistor P4 may be embodied as a P-type transistor, and transistors N3, N4 may be embodied as N-type transistors. In some embodiments, the transistors P4, N3, N4 can be replaced by a different component that can perform the functions of the transistors P4, N3, N4 described herein. In one configuration, the transistor P4 includes a gate electrode coupled to the output port of the NAND gate 420, a source electrode coupled to a metal rail providing a supply voltage VDD, and a drain electrode coupled to a drain electrode of the transistor N4. In one configuration, the transistor N4 includes a gate electrode coupled to the logic circuit 430, a source electrode coupled to a drain electrode of the transistor N3, and a drain electrode coupled to the drain electrode of the transistor P4. In one configuration, the transistor N3 includes a gate electrode to receive a clock signal CLK, a source electrode coupled to a metal rail providing a ground voltage GND, and a drain electrode coupled to the source electrode of the transistor N4. In this configuration, the transistors P4, N4, N3 can operate together to generate a signal or a pulse to provide to the inverters 450, 460. For example, in response to the output port of the NAND gate 420 having a logic value '1' or a supply voltage VDD, the transistor P4 can be disabled to electrically decouple the metal rail supplying the supply voltage VDD from the drain electrodes of the transistors P4, N4. For example, in response to the output port of the NAND gate 420 having a logic value '0' or a ground voltage GND, the transistor P4 can be enabled to electrically couple the metal rail supplying the supply voltage VDD to the drain electrodes of the transistors P4, N4, such that the drain electrodes of the transistors P4, N4 can have the supply voltage VDD. For example, in response to at least one of i) a signal from the logic circuit 430 at the gate electrode of the transistor N4 or ii) the clock signal CLK at the gate electrode of the transistor N3 having a logic value '0' or a ground voltage GND, the transistor N3 and/or the transistor N4 can be disabled to electrically decouple the metal rail supplying the ground voltage GND from the drain electrodes of the transistors P4, N4. For example, in response to both i) the signal from the logic circuit 430 at the gate electrode of the transistor N4 and ii) the clock signal CLK at the gate electrode of the transistor N3 having a logic value '1' or a supply voltage VDD, the transistors N3, N4 can be enabled to electrically couple the metal rail supplying the ground voltage GND to the drain electrodes of the transistors P4, N4, such that the drain electrodes of the transistors P4, N4 can have the ground voltage GND.

In some embodiments, the latch 440 is a circuit or a component that can amplify and hold a voltage at the drain electrodes of the transistors P4, N4 or the input ports of the inverters 450, 460. In some embodiments, the latch 440 can be replaced by a different component that can perform the functions of the latch 440 described herein. In one configuration, the latch 440 is coupled to the drain electrodes of the transistors P4, N4, and input ports of the inverters 450, 460. In this configuration, the latch 440 can maintain a voltage at the drain electrodes of the transistors P4, N4, when the voltage at the drain electrodes of the transistors P4, N4 is, for example, between 0 V~0.3 V or 0.7 V~1.0 V. Hence, the latch 440 can provide, to the input ports of the inverters 450, 460, a signal or a pulse that is less susceptible to noise or glitches.

In some embodiments, the inverter 450 is a circuit or a component that can provide a signal or a pulse to one or more tracking cells 325 through a tracking word line TWL. In some embodiments, the inverter 450 can be replaced by a different component (e.g., amplifier or a drive circuit) that can perform the functions of the inverter 450 described herein. In one configuration, the inverter 450 includes an input port coupled to the drain electrodes of the transistors N4, P4, and an output port coupled to the tracking word line TWL. In this configuration, the inverter 450 can provide a signal or a pulse having an opposite phase of a signal or a pulse at the drain electrodes of the transistors N4, P4 to a tracking cell 325 through the tracking word line TWL.

In some embodiments, the inverter 460 is a circuit or a component that can provide a signal or a pulse to the word line controller 114 through a line GCKP. The line GCKP may be a metal rail coupled between the inverter 460 and the word line controller 114. In some embodiments, the inverter 460 can be replaced by a different component (e.g., amplifier or a drive circuit) that can perform the functions of the inverter 460 described herein. In one configuration, the inverter 460 includes an input port coupled to the drain electrodes of the transistors N4, P4, and an output port coupled to the line GCKP. In this configuration, the inverter 460 can provide a signal or a pulse having an opposite phase of a signal or a pulse at the drain electrodes of the transistors N4, P4 to the word line controller 114 through the line GCKP. In response to a signal or a pulse from the inverter 460 provided through the line GCKP, the word line controller 114 can apply a pulse to one or more memory cells 125 through a word line WL. In one aspect, the inverter 460 is similar to the inverter 450, except the inverter 460 may have a smaller size or a lower drive strength than the inverter 450, because the tracking word line TWL may have a larger parasitic capacitance than the line GCKP.

In one configuration, the transistor P3 is a circuit or a component that can pull up a voltage at the tracking bit line TBL. In some embodiments, the transistor P3 is embodied as a P-type transistor. In some embodiments, the transistor P3 can be replaced by a different component that can perform the functions of the transistor P3 described herein. In one configuration, the transistor P3 includes a gate electrode coupled to the line GCKP, a source electrode coupled to the metal rail providing the supply voltage VDD, and a drain electrode coupled to the tracking bit line TBL. In this configuration, the transistor P3 can pull up a voltage at the tracking bit line TBL, in response to a voltage at the line GCKP. For example, in response to the line GCKP having a supply voltage VDD, the transistor P3 can be disabled to electrically decouple the metal rail supplying the supply voltage from the tracking bit line TBL. For example, in response to the line GCKP having a ground voltage GND, the transistor P3 can be enabled to electrically couple the metal rail supplying the supply voltage to the tracking bit line TBL, such that the tracking bit line TBL can have the supply voltage VDD.

In some embodiments, the logic circuit 430 is a circuit that can control or configure operations of components of the control circuit 310. The logic circuit 430 can be implemented as any logic circuit. In some embodiments, the logic circuit 430 can be replaced by a different component that can perform the functions of the logic circuit 430 described herein. In one configuration, the logic circuit 430 includes input ports to receive a boost control signal BST and a clock signal CLK. In one configuration, the logic circuit 430 includes a first output port coupled to the NOR gate 410, a second output port coupled to the NAND gate 420, a third output port to provide a control signal 480, and a fourth output port coupled to the transistor N4. In one aspect, the logic circuit 430 may receive the boost control signal BST from an external circuit or a circuit within the timing controller 110. The boost control signal BST may be generated based on a user input to enable or disable boosting for a tracking word line TWL. For example, in response to the boost control signal BST having a logic value '1' or a supply voltage VDD, the logic circuit 430 can generate and provide a control signal 480 enabling the tracking booster circuit 330 to perform boosting for the tracking word line TWL. For example, in response to the boost control signal BST having a logic value '0' or a ground voltage GND, the logic circuit 430 can generate and provide a control signal 480 disabling the tracking booster circuit 330 from performing boosting for the tracking word line TWL. In one aspect, the logic circuit 430 may receive the clock signal CLK from an external circuit or a circuit within the timing controller 110. The logic circuit 430 can generate and provide signals to the NOR gate 410, the NAND gate 420, and the transistor N4 having edges or pulse widths according to the clock signal CLK. For example, the logic circuit 430 can generate and provide signals to the NOR gate 410, the NAND gate 420, and the transistor N4 to cause the inverter 460 to generate a pulse at the line GCKP to have a predetermined pulse width, in response to an edge (e.g., falling edge) of a pulse at the tracking bit line TBL. The predetermined pulse width may correspond to a time period for memory cell 125 to successfully perform read or write operation. Example of various signals or pulses generated by the control circuit 310 are provided below in FIG. 5.

Figure 5:
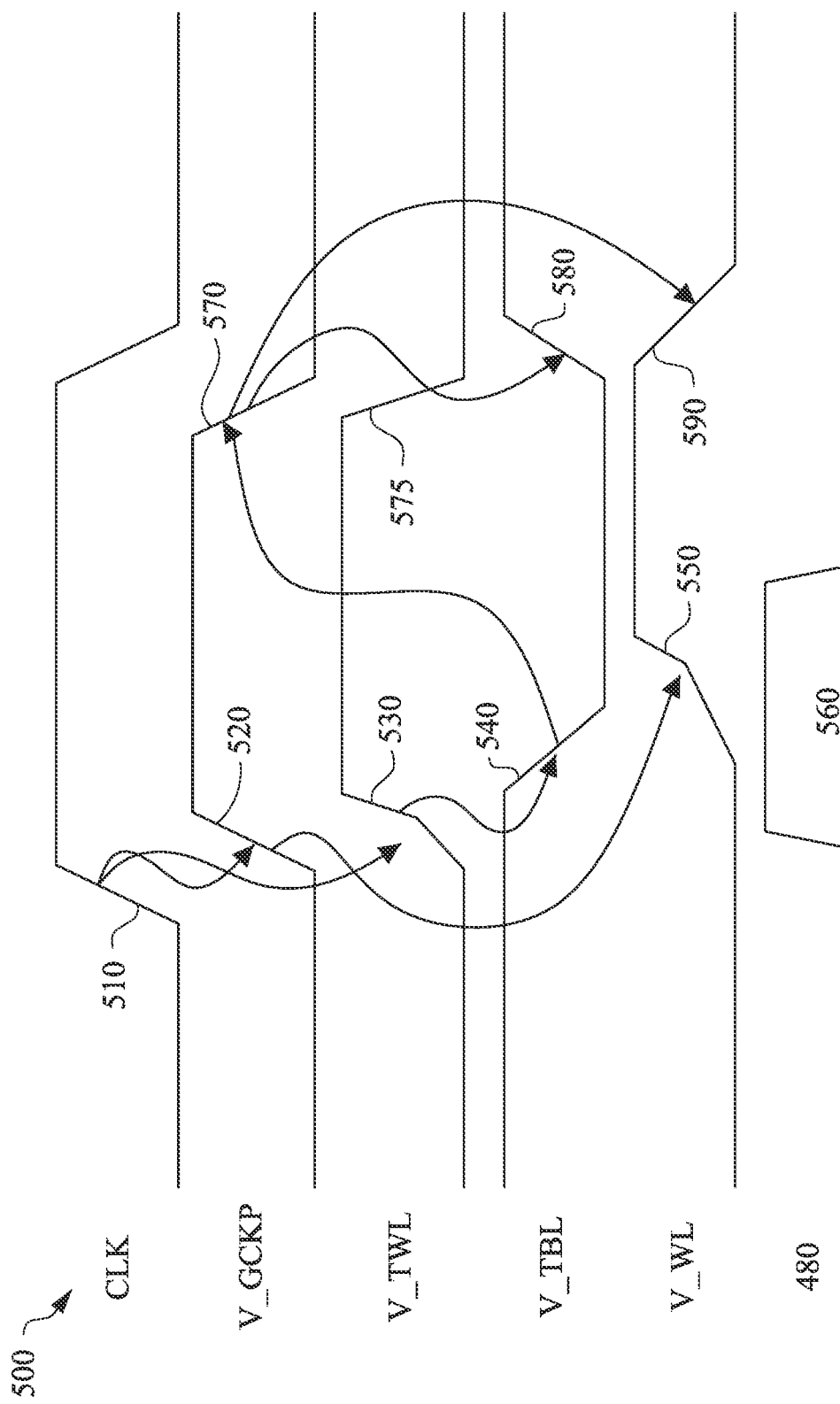
FIG. 5 illustrates an example timing diagram showing waveforms of pulses of a memory device with boosting for a word line and a tracking word line, in accordance with some embodiments.

FIG. 5 illustrates an example timing diagram 500 showing waveforms of pulses CLK, V_GCKP, V_TWL, V_TBL, V_WL, and the control signal 480 of the memory device 110' with boosting for a word line WL and a tracking word line TWL, in accordance with some embodiments. In one aspect, the pulse V_GCKP is a voltage or a pulse at the line GCKP. In one aspect, the pulse V_TWL is a voltage or a pulse at the tracking word line TWL. In one aspect, the pulse V_TBL is a voltage or a pulse at the tracking bit line TBL. In one aspect, the pulse V_WL is a voltage or a pulse at the word line WL.

In one aspect, the control circuit 310 receives the clock signal CLK. The clock signal CLK may have a rising edge 510. In response to the rising edge 510 of the clock signal CLK, the control circuit 310 may generate a rising edge 520 of the pulse V_GCKP at the line GCKP. For example, in response to the rising edge 510 of the clock signal CLK, the logic circuit 430 can generate a signal to enable the transistor N4, such that both transistors N3, N4 can be enabled to pull down a voltage at the input port of the inverter 460. In response to the voltage at the input port of the inverter 460 being a ground voltage GND, the inverter 460 can set a voltage at the line GCKP to be a supply voltage VDD, such that the pulse V_GCKP can have the rising edge 520.

In response to the rising edge 510 of the clock signal CLK, the control circuit 310 may generate a rising edge 530 of the pulse V_TWL at the tracking word line TWL. In response to the voltage at the input port of the inverter 450 being a ground voltage GND, the inverter 450 can set a voltage at the tracking word line TWL to be a supply voltage VDD. In one aspect, the rising edge 530 of the pulse V_TWL is delayed compared to the rising edge 520 of the pulse V_GCKP, because the tracking word line TWL may have a larger capacitive loading or a larger parasitic capacitance than the line GCKP. In one aspect, the tracking booster circuit 330 may be enabled to boost the rising edge 530 of the pulse V_TWL. For example, if the boost control signal BST has a logic value '1' or a supply voltage, the logic circuit 430 can generate a control signal 480 having a predetermined pulse width 560, in response to the rising edge 510 of the clock signal CLK, and provide the control signal 480 to the tracking booster circuit 330. The pulse width 560 may correspond to an expected time for a rising edge 530 of the pulse V_TWL. While the pulse 480 has the logic high value '1' or a supply voltage VDD, the tracking booster circuit 330 can be enabled and boost the rising edge 530 of the pulse V_TWL, such that the pulse V_TWL can have a faster or a sharper edge 530.

In response to the rising edge 530 of the pulse V_TWL, the pulse V_TBL at the tracking bit line TBL may have a falling edge 540. For example, in response to the rising edge 530 of the pulse V_TWL, the tracking cell 325 can pull down a voltage at the tracking bit line TBL. In one aspect, the falling edge 540 of the tracking bit line TBL may indicate or simulate a response time of a memory cell 125 in response to a pulse applied to a memory cell 125.

In response to the rising edge 520 of the pulse V_GCKP, the pulse V_WL at the word line WL may have a rising edge 550. For example, the word line controller 114 can receive the pulse V_GCKP through the line GCKP. In response to the rising edge 520 of the pulse V_GCKP, the word line controller 114 can generate the pulse V_WL having the rising edge 550. In one aspect, the rising edge 550 of the pulse V_WL at the word line WL is delayed compared to the rising edge 530 of the pulse V_TWL at the tracking word line TWL, because the word line WL may have a larger loading or a larger parasitic capacitance than the tracking word line TWL. In one aspect, the booster circuit 350 may boost the rising edge 550 of the pulse V_WL, such that pulse V_WL can have a faster or a sharper edge 550.

In one aspect, the control circuit 310 generates the falling edge 575 of the pulse V_TWL at the tracking word line TWL and the falling edge 570 of the pulse V_GCKP at the line GCKP, in response to the falling edge 540 of the pulse V_TBL at the tracking bit line TBL. For example, the logic circuit 430 can generate signals and applies the signals to the NOR gate 410, the NAND gate 420, and the transistor N4 to enable the transistor P4 and disable the transistor N4, after a predetermined time period has passed from the falling edge 540 of the pulse V_TBL at the tracking bit line TBL. The predetermined time period may correspond to a time period to ensure the memory cell 125 to perform a read or write operation correctly. By enabling the transistor P4, the voltage at the input ports of the inverters 450, 460 can be pulled up to the supply voltage VDD. By pulling up the voltage at the input port of the inverter 450, the inverter 450 can generate the falling edge 575 of the pulse V_TWL at the tracking word line TWL. Moreover, by pulling up the voltage at the input port of the inverter 460, the inverter 460 can generate the falling edge 570 of the pulse V_GCKP at the line GCKP. The clock signal CLK may have a falling edge after the falling edge 570 of the pulse V_GCKP.

In one aspect, the control circuit 310 causes the pulse V_TBL at the tracking bit line TBL to have a rising edge 580 and the pulse V_WL at the word line WL to have a falling edge 590, in response to the falling edge 570 of the pulse V_GCKP at the line GCKP. For example, in response to the falling edge 570 of the pulse V_GCKP, the transistor P3 can be enabled to pull up the voltage at the tracking bit line TBL to the supply voltage VDD, such that the pulse V_TBL can have the rising edge 580. Moreover, in response to the falling edge 570 of the pulse V_GCKP, the word line controller 114 can generate the falling edge 590 of the pulse V_WL. In one aspect, because the falling edge 570 of the pulse V_GCKP is generated after the predetermined time period has passed from the falling edge 540 of the pulse V_TBL, the pulse V_WL at the word line WL can have a sufficient pulse width to ensure correct read/write operation of memory cells 125.

Advantageously, the disclosed memory device 100' with the tracking booster circuit 330 can achieve improved performances. In one aspect, a pulse V_WL applied to a word line WL of a set of memory cells 125 can be generated, according to a timing response of a tracking cell 325 to ensure correct read/write operations of the set of memory cells 125. In one aspect, the word line WL may have a large parasitic capacitance or a large capacitive loading. Such large parasitic capacitance or large capacitive loading may degrade an edge 550 of the pulse V_WL. To improve the edge 550 of the pulse V_WL applied to the word line WL, a booster circuit 350 can be implemented. For example, the booster circuit 350 may speed up a transition of states in the pulse V_WL applied to the word line WL from one state to another state, such that the pulse V_WL can have a faster or a sharper edge 550. However, when boosting is performed for the word line WL but not for the tracking word line TWL, a tracking cell 325 may not simulate or replicate a behavior or characteristic of a set of memory cells 125 well. By implementing a tracking booster circuit 330 to boost the edge (e.g., rising edge 530) of the pulse V_TWL at the tracking word line TWL coupled to a tracking cell 325, the tracking cell 325 can better simulate or predict a behavior or characteristic of a set of memory cells 125 coupled to a word line WL. Moreover, an edge 590 (e.g., falling edge) of the pulse V_WL applied to the word line WL may be generated based on an edge 530 of a pulse V_TWL applied to the tracking word line TWL. By improving or boosting the edge 530 of the pulse V_TWL applied to the tracking word line TWL, the edge 590 of the pulse V_WL applied to the word line WL can occur faster, such that the pulse V_WL applied to the word line WL can have a narrower pulse width. By reducing a pulse width of the pulse V_WL applied to the word line WL, an operating speed of the memory device 100' can be improved.

FIG. 6A illustrates an example timing diagram 600A of waveforms of pulses CLK, V_TWL, V_WL of the memory device 100' when boosting for a word line WL and a tracking word line TWL is disabled, in accordance with some embodiments. FIG. 6B illustrates an example timing diagram 600B of waveforms of pulses CLK, V_TWL, V_WL of the memory device 100' when boosting for a word line WL and a tracking word line TWL is enabled, in accordance with some embodiments. In one aspect, the control circuit 310 can selectively enable or disable boosting, according to a boost control signal BST. For example, when boosting is not performed for a word line WL, the boost control signal BST can have a logic value '0' or a ground voltage GND to bypass boosting by the tracking booster circuit 330, such that the pulse V_WL at the word line WL can have a rising edge 552 and the pulse V_TWL at the tracking word line TWL can have a rising edge 532 without boosting, as shown in FIG. 6A. For example, when boosting is performed for a word line WL, the boost control signal BST can have a logic value '1' or a supply voltage VDD to enable boosting by the tracking booster circuit 330, such that the pulse V_WL at the word line WL can have the rising edge 550 and the pulse V_TWL at the tracking word line TWL can have the rising edge 530 with boosting, as shown in FIG. 6B. In one aspect, the boosting can be selectively performed such that the pulse V_TWL can have an edge 530 close to the edge 550 of the pulse V_WL.

Figure 7:
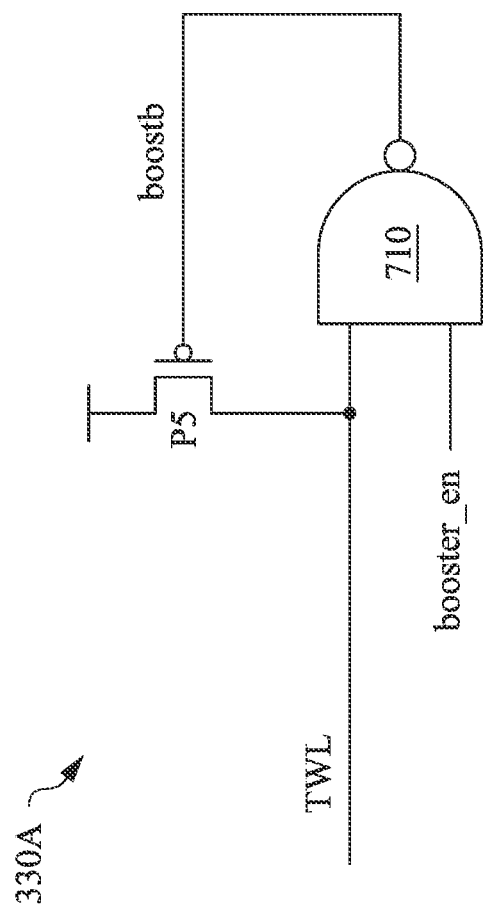
FIG. 7 illustrates a schematic diagram of an example tracking booster circuit, in accordance with some embodiments.

FIG. 7 illustrates a schematic block diagram of an example tracking booster circuit 330A, in accordance with some embodiments. In some embodiments, the tracking booster circuit 330A includes a transistor P5 and a NAND gate 710. In some embodiments, the transistor P5 is implemented as a P-type transistor. These components may operate together to boost or modify an edge (e.g., rising edge) of the pulse V_TWL at the tracking word line TWL. In some embodiments, the tracking booster circuit 330A includes more, fewer, or different components than shown in FIG. 7.

In some embodiments, the NAND gate 710 is a circuit or a component that can perform a NAND operation on the pulse V_TWL and a signal booster_en to generate a signal boostb. The signal booster_en may be the control signal 480 from the logic circuit 430 or generated based on the control signal 480. The signal boostb may be a signal to control an operation of the transistor P5. In some embodiments, the NAND gate 710 can be replaced by a different component that can perform the functions of the NAND gate 710 described herein. In one configuration, the NAND gate 710 includes a first input port coupled to the tracking word line TWL, a second input port to receive a booster enable signal booster_en, and an output port coupled to a gate electrode of the transistor P5. In this configuration, the NAND gate 710 may perform a NAND operation on the pulse V_TWL at the tracking word line TWL and the signal booster_en to generate the signal boostb at the output port. For example, in response to at least one of i) the pulse V_TWL at the tracking word line TWL and ii) the signal booster_en having a logic value '0' or a ground voltage GND, the NAND gate 710 can generate the signal boostb having a logic value '1' or a supply voltage VDD. For example, in response to both i) the pulse V_TWL at the tracking word line TWL and ii) the signal booster_en having a logic value '1' or a supply voltage VDD, the NAND gate 710 can generate the signal boostb having a logic value '0' or a ground voltage GND.

In some embodiments, the transistor P5 is a circuit or a component that can selectively pull up a voltage at the tracking word line TWL to perform boosting, according to the signal boostb. In some embodiments, the transistor P5 can be replaced by a different component that can perform the functions of the transistor P5. In one configuration, the transistor P5 includes a gate electrode coupled to the output port of the NAND gate 710, a source electrode coupled to a metal rail providing a supply voltage VDD, and a drain electrode coupled to the tracking word line TWL or the first input port of the NAND gate 710. In this configuration, the transistor P5 can selectively pull up a voltage at the tracking word line TWL, according to the signal boostb. For example, The logic circuit 430 can generate the signal booster_en having a logic value '1' or a supply voltage VDD to enable boosting, during a rising edge (e.g., edge 530) of the pulse V_TWL at the tracking word line TWL. When the signal booster_en has a logic value '1' or a supply voltage VDD to enable boosting, the transistor P5 may be enabled to assist increasing or pulling up the voltage at the tracking word line TWL to the supply voltage VDD, such that the pulse V_TWL can have a faster edge (e.g., edge 530). The logic circuit 430 can generate the signal booster_en having a logic value '0' or a ground voltage GND to disable boosting, before a falling edge (e.g., edge 575) of the pulse V_TWL at the tracking word line TWL is predicted to occur. In response to the signal booster_en having a logic value '0' or a ground voltage GND, the transistor P5 may be disabled regardless of the pulse V_TWL at the tracking word line TWL.

Figure 8A:
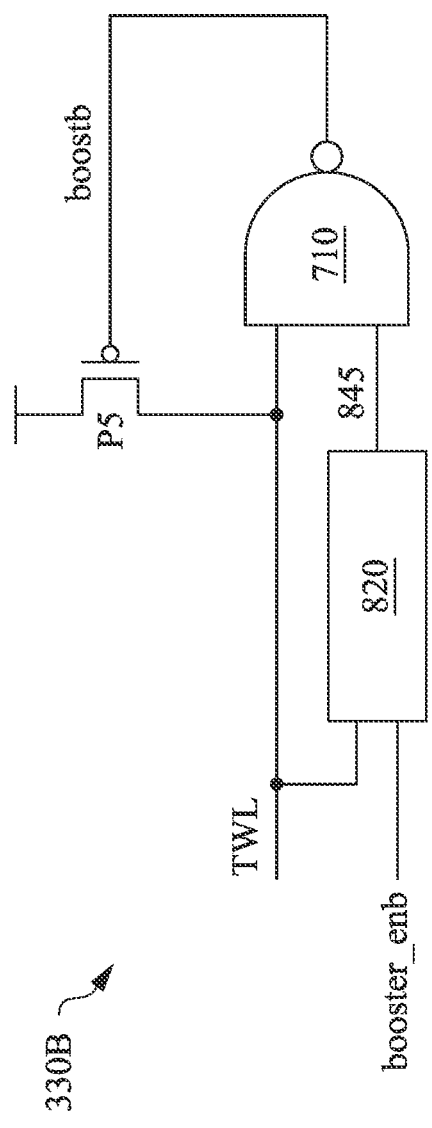
FIG. 8A illustrates a schematic diagram of an example tracking booster circuit, in accordance with some embodiments.

FIG. 8A illustrates a schematic block diagram of an example tracking booster circuit 330B, in accordance with some embodiments. The tracking booster circuit 330B is similar to the tracking booster circuit 330A of FIG. 7, except the tracking booster circuit 330B includes a boost control circuit 820. Thus, detailed description of duplicated portion thereof is omitted herein for the sake of brevity.

Figure 8B:
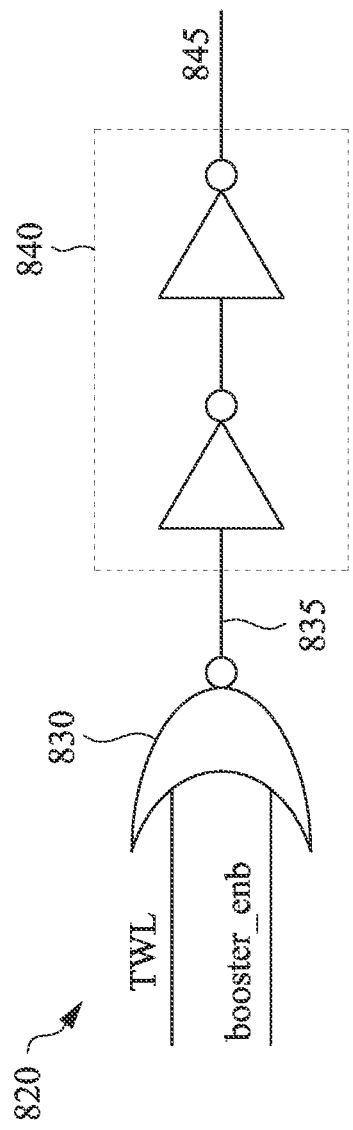
FIG. 8B illustrates a schematic diagram of an example boost control circuit, in accordance with some embodiments.

In one aspect, the boost control circuit 820 is a circuit or a component that can automatically disable boosting before a falling edge 575 of the pulse V_TWL at the tracking word line TWL. In some embodiments, the boost control circuit 820 is embodied as a logic circuit. For example, the boost control circuit 820 includes a NOR gate 830 and a delay cell 840 as shown in FIG. 8B. The delay cell 840 may have an even number of cascaded inverters.

In one configuration, the NOR gate 830 includes a first input port coupled to the tracking word line TWL, a second input port to receive a signal booster_enb, and an output port coupled to an input port of the delay cell 840. The signal booster_enb may be the control signal 480 from the logic circuit 430 or generated based on the control signal 480. The signal booster_enb may have an inverted phase of the signal booster_en. In one configuration, the delay cell 840 includes an output port coupled to the second input port of the NAND gate 710. In this configuration, the NOR gate 830 may perform a NOR operation on the pulse V_TWL at the tracking word line TWL and the signal booster_enb to generate a signal 835 at the output port. For example, in response to both i) the pulse V_TWL at the tracking word line TWL and ii) the signal booster_enb having a logic value '0' or a ground voltage GND, the NOR gate 830 can generate the signal 835 having a logic value '1' or a supply voltage VDD. For example, in response to at least one of i) the pulse V_TWL at the tracking word line TWL and ii) the signal booster_enb having a logic value '1' or a supply voltage VDD, the NOR gate 830 can generate the signal 835 having a logic value '0' or a ground voltage GND.

In one aspect, the delay cell 840 is a circuit or a component that delays the signal 835 to generate a delayed signal 845. In some embodiments, the delay cell 840 is embodied as an even number of cascaded inverters. In some embodiments, the delay cell 840 can be replaced by a different circuit that can perform the functions of the delay cell 840 described herein. In one aspect, the delay cell 840 delays the signal 835 by a predetermined amount. The predetermined amount may be at least a predicted time for the pulse V_TWL at the tracking word line TWL to complete transition from the ground voltage GND to the supply voltage VDD for the rising edge 530 and less than a predicted time for the pulse V_TWL at the tracking word line TWL to initiate transition from the supply voltage VDD to the ground voltage GND for the falling edge 575. The delay cell 840 can provide the signal 845 to the second input port of the NAND gate 710.

Advantageously, the tracking booster circuit 330B can automatically disable boosting after the rising edge 530 of the pulse V_TWL. By automatically control timing of enabling or disabling the boosting for the tracking word line TWL, the logic circuit 430 can be implemented in a simple architecture, because the logic circuit 430 can provide the signal booster_enb having a DC voltage (or a fixed voltage), rather than a pulse having changing states to disable boosting for a falling edge 575 of the pulse V_TWL.

Figure 9:
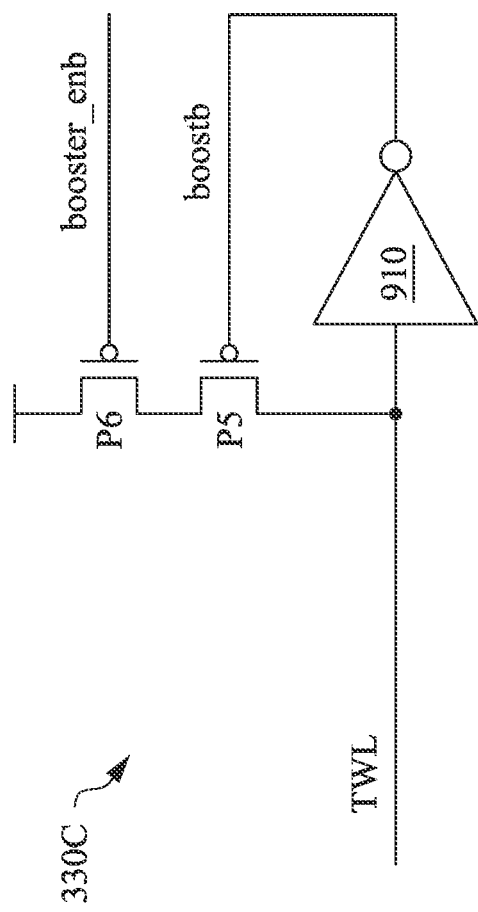
FIG. 9 illustrates a schematic diagram of an example tracking booster circuit, in accordance with some embodiments.

FIG. 9 illustrates a schematic block diagram of an example tracking booster circuit 330C, in accordance with some embodiments. The tracking booster circuit 330C is similar to the tracking booster circuit 330A in FIG. 7, except the tracking booster circuit 330C includes an inverter 910 instead of the NAND gate 710 and includes a transistor P6 coupled to the transistor P5. Thus, detailed description of duplicated portion thereof is omitted herein for the sake of brevity.

In some embodiments, the inverter 910 is a circuit or a component that can generate the signal boostb having an inverted phase of the pulse V_TWL at the tracking word line TWL. In some embodiments, the inverter 910 can be replaced by a different component that can perform the functions of the inverter 910 described herein. In one configuration, the inverter 910 includes an input port coupled to the tracking word line TWL, and an output port coupled to the gate electrode of the transistor P5. In this configuration, the inverter 910 can generate the signal boostb having an inverted phase of the pulse V_TWL, and provide the signal boostb to the gate electrode of the transistor P5.

In some embodiments, the transistor P6 is a circuit or a component that can enable or disable the transistor P5, according to the signal booster_enb. In some embodiments, the transistor P6 is embodied as a P-type transistor. In some embodiments, the transistor P6 can be replaced by a different component that can perform the functions of the transistor P6 described herein. In one configuration, the transistor P6 includes a gate electrode to receive the signal booster_enb, a source electrode coupled to a metal rail providing a supply voltage VDD, and a drain electrode coupled to the source electrode of the transistor P5. In this configuration, the transistor P6 can operate as a switch to enable or disable boosting by the transistor P5, according to the signal booster_enb. For example, in response to the signal booster_enb having a logic value '0' or a ground voltage, the transistor P6 can electrically couple the metal rail providing the supply voltage to the source electrode of the transistor P5 to allow the transistor P5 to boost the edge (e.g., edge 530) of the pulse V_TWL. For example, in response to the signal booster_enb having a logic value '1' or a supply voltage VDD, the transistor P6 can electrically decouple the metal rail providing the supply voltage from the source electrode of the transistor P5 to prevent the transistor P5 from boosting the edge (e.g., edge 530) of the pulse V_TWL.

Figure 10A:
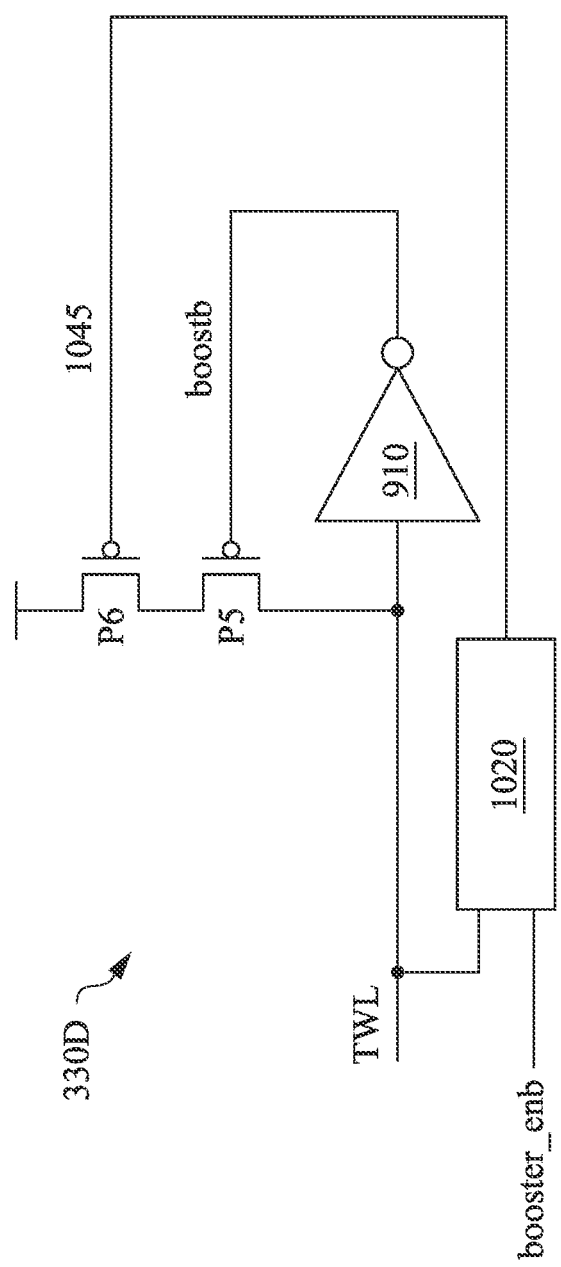
FIG. 10A illustrates a schematic diagram of an example tracking booster circuit, in accordance with some embodiments.
Figure 10B:
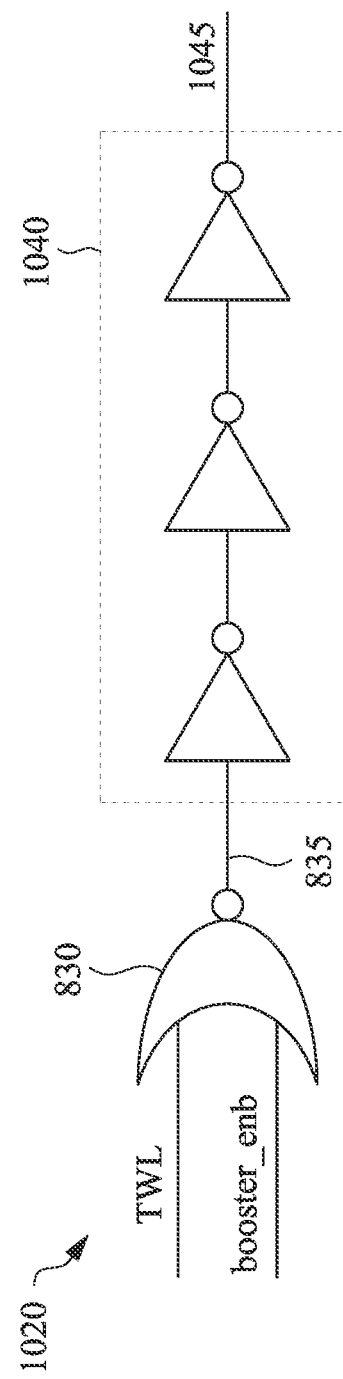
FIG. 10B illustrates a schematic diagram of an example boost control circuit, in accordance with some embodiments.

FIG. 10A illustrates a schematic block diagram of an example tracking booster circuit 330D, in accordance with some embodiments. The tracking booster circuit 330D is similar to the tracking booster circuit 330C of FIG. 9, except the tracking booster circuit 330D includes a boost control circuit 1020. Thus, detailed description of duplicated portion thereof is omitted herein for the sake of brevity.

In one aspect, the boost control circuit 1020 is a circuit or a component that can automatically disable boosting before a falling edge 575 of the pulse V_TWL at the tracking word line TWL. In some embodiments, the boost control circuit 1020 is embodied as a logic circuit. The boost control circuit 1020 is similar to the boost control circuit 820 of FIG. 8A, except the boost control circuit 1020 includes the delay cell 1040 instead of the delay cell 840. Thus, detailed description of duplicated portion thereof is omitted herein for the sake of brevity.

In one aspect, the delay cell 1040 includes an odd number of cascaded inverters. In some embodiments, the delay cell 1040 can be replaced by a different circuit that can perform the functions of the delay cell 1040 described herein. In one aspect, the delay cell 1040 delays the signal 835 by a predetermined amount. The predetermined amount may be at least a predicted time for the pulse V_TWL at the tracking word line TWL to complete transition from the ground voltage GND to the supply voltage VDD for the rising edge 530 and less than a predicted time for the pulse V_TWL at the tracking word line TWL to initiate transition from the supply voltage VDD to the ground voltage GND for the falling edge 575. Because the delay cell 1040 includes an odd number of inverters, the signal 1045 may have an inverted phase of the signal 835. The delay cell 1040 can provide the signal 1045 to the gate electrode of the transistor P6 to enable or disable the transistor P6.

Advantageously, the tracking booster circuit 330D can automatically disable boosting after the rising edge 530 of the pulse V_TWL. By automatically control timing of enabling or disabling the boosting for the tracking word line TWL, the logic circuit 430 can be implemented in a simple architecture, because the logic circuit 430 can provide the signal booster_enb having a DC voltage (or a fixed voltage), rather than a pulse having changing states to disable boosting for a falling edge 575 of the pulse V_TWL.

Figure 11:
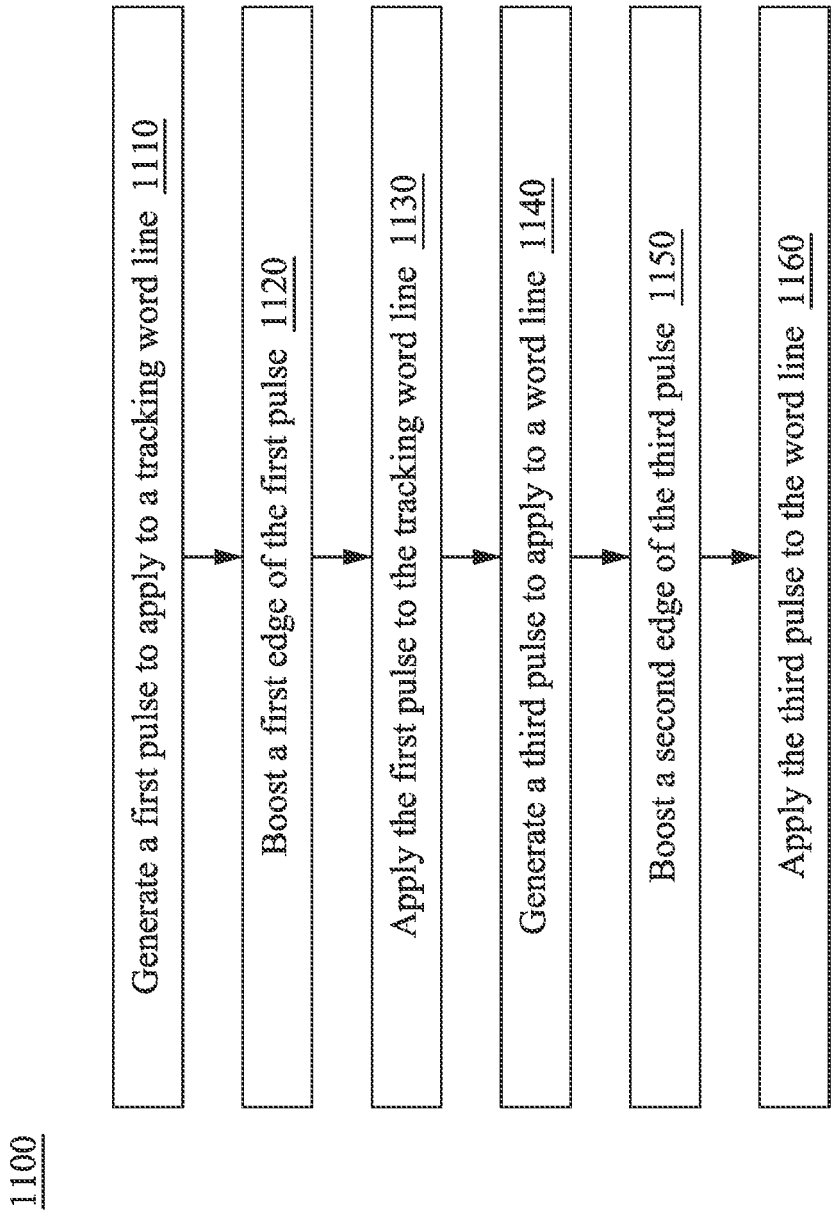
FIG. 11 is a flowchart showing a method of operating a memory device with boosting for a tracking word line, in accordance with some embodiments.

FIG. 11 is a flowchart showing a method 1100 of operating a memory device 100' with boosting for a tracking word line TWL, in accordance with some embodiments. In some embodiments, the method 1100 is performed by a controller (e.g., memory controller 105). In some embodiments, the method 1100 is performed by other entities. In some embodiments, the method 1100 is performed in the writing phase or in the reading phase. In some embodiments, the method 1100 includes more, fewer, or different steps than shown in FIG. 11. In some embodiments, the method 1100 can be performed in a different order than shown in FIG. 11.

In one approach, the memory controller 105 generates 1110 a first pulse V_TWL to apply to a tracking word line TWL. The memory controller 105 (or control circuit 310) may receive a clock signal CLK, for example, from an external component or a timing controller 110. The memory controller 105 (or control circuit 310) may detect a rising edge (e.g., rising edge 510) of the clock signal CLK. In response to the rising edge (e.g., rising edge 510) of the clock signal CLK, the memory controller 105 (or the control circuit 310) may generate a rising edge (e.g., rising edge 520) of a pulse V_GCKP at a line GCKP. In addition, in response to the rising edge (e.g., rising edge 510) of the clock signal CLK, the memory controller 105 (or the control circuit 310) may generate a first edge (e.g., rising edge 530) of the first pulse (e.g., pulse V_TWL) at the tracking word line TWL.

In one approach, the memory controller 105 (or tracking booster circuit 330) boosts 1120 a first edge (e.g., rising edge 530) of the first pulse (e.g., pulse V_TWL). For example, the tracking booster circuit 330 can adjust the first pulse (e.g., pulse V_TWL) to have a faster edge (e.g., rising edge 530).

In one approach, the memory controller 105 (or the control circuit 310) applies 1130 the first pulse (e.g., pulse V_TWL) to the tracking word line TWL. In one aspect, the first pulse (e.g., pulse V_TWL) with the boosted first edge (e.g., rising edge 530) can be applied to a tracking cell 325 through the tracking word line TWL. In response to the first pulse (e.g., pulse V_TWL) applied to the tracking cell 325, the tracking cell 325 may generate a second pulse (e.g., pulse V_TBL) at the tracking bit line TBL.

In one approach, the memory controller 105 (or the word line controller 114) generates 1140 a third pulse (or a pulse V_WL) to apply to a word line WL. For example, the word line controller 114 can receive the pulse V_GCKP at the line GCKP. In response to the rising edge 520 of the pulse V_GCKP at the line GCKP, the word line controller 114 can generate a rising edge 550 of the pulse V_WL at the word line WL.

In one approach, the memory controller 105 (or the booster circuit 350) boosts 1150 a second edge (e.g., rising edge 550) of the third pulse (e.g., pulse V_WL).

In one approach, the memory controller 105 (or booster circuit 350) applies 1160 the third pulse (e.g., pulse V_WL) having the boosted second edge (e.g., rising edge 550) to the word line WL. In one aspect, the memory controller 105 (or control circuit 310) can receive the second pulse (e.g., pulse V_TBL) and set a pulse width of the third pulse (e.g., pulse V_WL) based on the second pulse (e.g., pulse V_TBL). For example, the memory controller 105 (or the control circuit 310) may generate a falling edge 570 of the pulse V_GCKP at the line GCKP, after a predetermined time has passed from a falling edge (e.g., falling edge 540) of the second pulse (e.g., pulse V_TBL). The predetermined time may be a time to apply the pulse V_WL at the word line WL to ensure correct read/write operation of memory cells 125. The memory controller 105 (or the word line controller 114) may generate a falling edge (e.g., falling edge 590) of the third pulse (e.g., pulse V_WL), in response to the falling edge (e.g., falling edge 570) of the pulse V_GCKP. Hence, the pulse V_WL may have a pulse width set or determined, based on the rising edge 530 of the pulse V_TWL or the falling edge 540 of the pulse V_TBL.

Advantageously, the disclosed memory device 100' with the tracking booster circuit 330 can achieve improved performances. In one aspect, a pulse V_WL applied to a word line WL of a set of memory cells 125 can be generated, according to a timing response of a tracking cell 325 to ensure correct read/write operations of the set of memory cells 125. In one aspect, the word line WL may have a large parasitic capacitance or a large capacitive loading. Such large parasitic capacitance or large capacitive loading may degrade an edge 550 of the pulse V_WL. To improve the edge 550 of the pulse V_WL applied to the word line WL, a booster circuit 350 can be implemented. For example, the booster circuit 350 may speed up a transition of states in the pulse V_WL applied to the word line WL from one state to another state, such that the pulse V_WL can have a faster or a sharper edge 550. However, when a boosting is performed for the word line WL but not for the tracking word line TWL, a tracking cell 325 may not simulate or replicate a behavior or characteristic of a set of memory cells 125 well. By implementing a tracking booster circuit 330 to boost an edge (e.g., edge 530) of the pulse V_TWL at the tracking word line TWL coupled to a tracking cell 325, the tracking cell 325 can better simulate or predict a behavior or characteristic of a set of memory cells 125 coupled to a word line WL. Moreover, an edge 590 (e.g., falling edge) of the pulse V_WL applied to the word line WL may be generated based on an edge 530 of a pulse V_TWL applied to the tracking word line TWL. By improving or boosting the edge 530 of the pulse V_TWL applied to the tracking word line TWL, the edge 590 of the pulse V_WL applied to the word line WL can occur faster, such that the pulse V_WL applied to the word line WL can have a narrower pulse width. By reducing a pulse width of the pulse V_WL applied to the word line WL, an operating speed of the memory device 100' can be improved.

Figure 12:
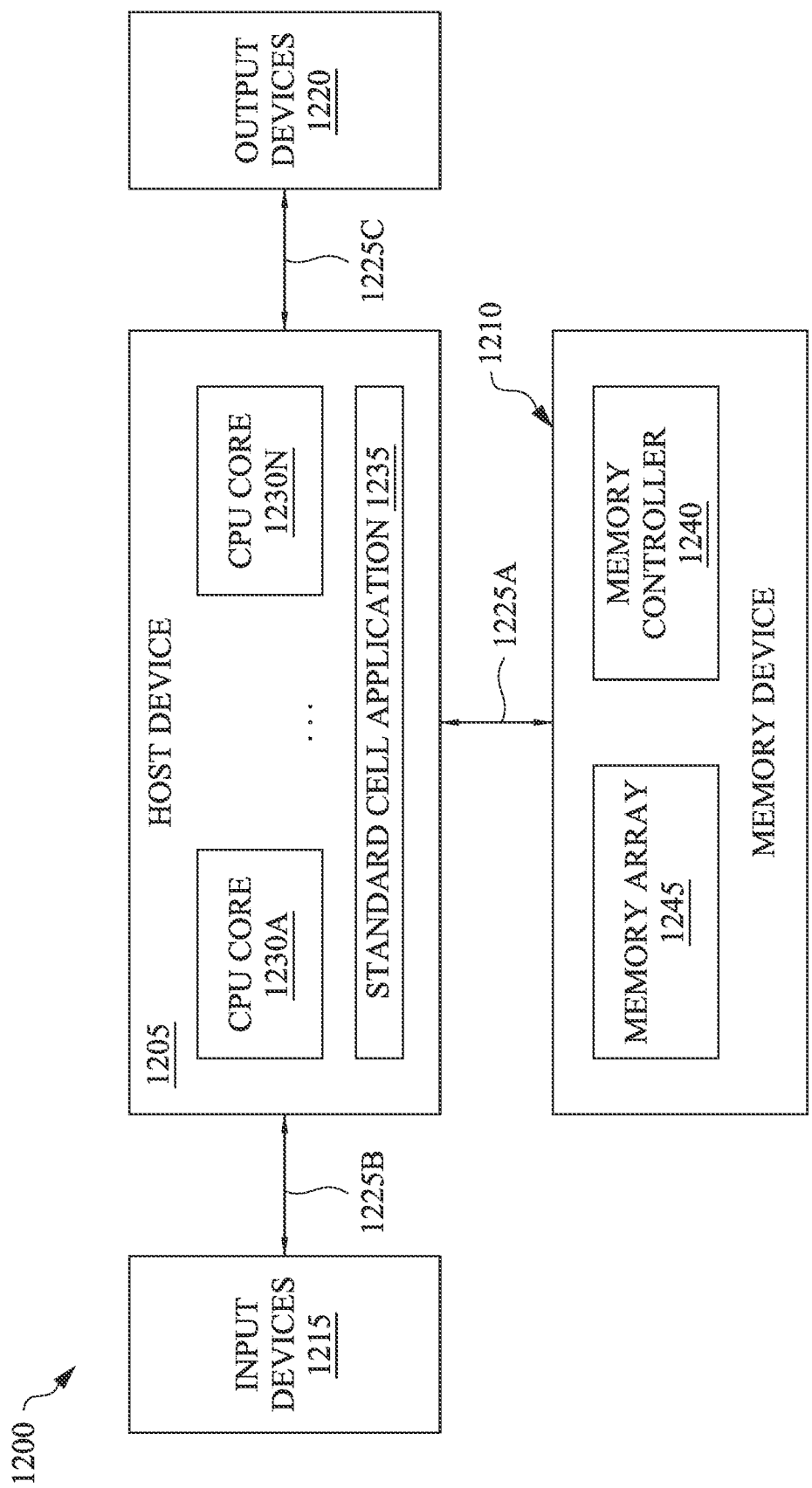
FIG. 12 is an example block diagram of a computing system, in accordance with some embodiments.

Referring now to FIG. 12, an example block diagram of a computing system 1200 is shown, in accordance with some embodiments of the disclosure. The computing system 1200 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1200 includes a host device 1205 associated with a memory device 1210. The host device 1205 may be configured to receive input from one or more input devices 1215 and provide output to one or more output devices 1220. The host device 1205 may be configured to communicate with the memory device 1210, the input devices 1215, and the output devices 1220 via appropriate interfaces 1225A, 1225B, and 1225C, respectively. The computing system 1200 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1205.

The input devices 1215 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1205 and that allows an external source, such as a user (e.g., a circuit or layout designer), to enter information (e.g., data) into the host device and send instructions to the host device. Similarly, the output devices 1220 may include a variety of output technologies such as external memories, printers, speakers, displays, microphones, light emitting diodes, headphones, video devices, and any other output peripherals that are configured to receive information (e.g., data) from the host device 1205. The "data" that is either input into the host device 1205 and/or output from the host device may include any of a variety of textual data, circuit data, signal data, semiconductor device data, graphical data, combinations thereof, or other types of analog and/or digital data that is suitable for processing using the computing system 1200.

The host device 1205 includes or is associated with one or more processing units/processors, such as Central Processing Unit ("CPU") cores 1230A . . . 1230N. The CPU cores 1230A . . . 1230N may be implemented as an Application Specific Integrated Circuit ("ASIC"), Field Programmable Gate Array ("FPGA"), or any other type of processing unit. Each of the CPU cores 1230A . . . 1230N may be configured to execute instructions for running one or more applications of the host device 1205. In some embodiments, the instructions and data to run the one or more applications may be stored within the memory device 1210. The host device 1205 may also be configured to store the results of running the one or more applications within the memory device 1210. Thus, the host device 1205 may be configured to request the memory device 1210 to perform a variety of operations. For example, the host device 1205 may request the memory device 1210 to read data, write data, update or delete data, and/or perform management or other operations. One such application that the host device 1205 may be configured to run may be a standard cell application 1235. The standard cell application 1235 may be part of a computer aided design or electronic design automation software suite that may be used by a user of the host device 1205 to use, create, or modify a standard cell of a circuit. In some embodiments, the instructions to execute or run the standard cell application 1235 may be stored within the memory device 1210. The standard cell application 1235 may be executed by one or more of the CPU cores 1230A . . . 1230N using the instructions associated with the standard cell application from the memory device 1210. In one example, the standard cell application 1235 allows a user to utilize pre-generated schematic and/or layout designs of the memory device 100 (or memory device 100') or a portion of the memory device 100 (or memory device 100') to aid integrated circuit design. After the layout design of the integrated circuit is complete, multiples of the integrated circuit, for example, including the memory device 100 (or memory device 100'), or any portion of the memory device 100 (or memory device 100') can be fabricated according to the layout design by a fabrication facility.

Referring still to FIG. 12, the memory device 1210 includes a memory controller 1240 that is configured to read data from or write data to a memory array 1245. The memory array 1245 may include a variety of volatile and/or non-volatile memories. For example, in some embodiments, the memory array 1245 may include NAND flash memory cores. In other embodiments, the memory array 1245 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1245 may be individually and independently controlled by the memory controller 1240. In other words, the memory controller 1240 may be configured to communicate with each memory within the memory array 1245 individually and independently. By communicating with the memory array 1245, the memory controller 1240 may be configured to read data from or write data to the memory array in response to instructions received from the host device 1205. Although shown as being part of the memory device 1210, in some embodiments, the memory controller 1240 may be part of the host device 1205 or part of another component of the computing system 1200 and associated with the memory device 1210. The memory controller 1240 may be implemented as a logic circuit in either software, hardware, firmware, or combination thereof to perform the functions described herein. For example, in some embodiments, the memory controller 1240 may be configured to retrieve the instructions associated with the standard cell application 1235 stored in the memory array 1245 of the memory device 1210 upon receiving a request from the host device 1205.

It is to be understood that only some components of the computing system 1200 are shown and described in FIG. 12. However, the computing system 1200 may include other components such as various batteries and power sources, networking interfaces, routers, switches, external memory systems, controllers, etc. Generally speaking, the computing system 1200 may include any of a variety of hardware, software, and/or firmware components that are needed or considered desirable in performing the functions described herein. Similarly, the host device 1205, the input devices 1215, the output devices 1220, and the memory device 1210 including the memory controller 1240 and the memory array 1245 may include other hardware, software, and/or firmware components that are considered necessary or desirable in performing the functions described herein.

In one aspect of the present disclosure, a memory device is disclosed. In some embodiments, the memory device includes a set of memory cells coupled to a word line. In some embodiments, the memory device includes a tracking cell coupled to a tracking word line and a tracking bit line. In some embodiments, the memory device includes a tracking booster circuit coupled to the tracking word line. In some embodiments, the tracking booster circuit is configured to boost a first edge of a first pulse applied to the tracking word line. In some embodiments, the tracking cell is configured to generate a second pulse at the tracking bit line, in response to the first pulse having the boosted first edge. In some embodiments, the memory device includes a word line controller configured to apply a third pulse to the word line, based on the second pulse.

In another aspect of the present disclosure, a memory device is disclosed. In some embodiments, the memory device includes a memory array. In some embodiments, the memory array includes a first set of memory cells coupled to a bit line. At least one of the first set of memory cells may be coupled to a first word line. In some embodiments, the memory array includes a second set of memory cells coupled to a second word line. In some embodiments, the second set of memory cells has a larger number of memory cells than the first set of memory cells. In some embodiments, the memory device includes a first booster circuit coupled to the first word line. In some embodiments, the first booster circuit is configured to boost a first edge of a first pulse applied to the first word line. In some embodiments, the at least one of the first set of memory cells is configured to generate a second pulse at the bit line, in response to the first pulse having the boosted first edge. In some embodiments, the memory device includes a word line controller configured to apply a third pulse to the second word line, based on the second pulse. In some embodiments, the memory device includes a second booster circuit coupled to the second word line. In some embodiments, the second booster circuit is configured to boost a second edge of the third pulse applied to the second word line.

In yet another aspect of the present disclosure, a method of operating a memory device is disclosed. In some embodiments, the method includes generating, by a memory controller, a first pulse having a first edge. In some embodiments, the method includes boosting, by the memory controller, the first edge of the first pulse. In some embodiments, the method includes applying, by the memory controller, the first pulse having the boosted first edge to a tracking word line coupled to a tracking cell. In some embodiments, the tracking cell is configured to generate a second pulse at a tracking bit line coupled to the tracking cell, responsive to the first pulse having the boosted first edge. In some embodiments, the method includes generating, by the memory controller, a third pulse. In some embodiments, the method includes boosting, by the memory controller, a second edge of the third pulse. In some embodiments, the method includes applying, by the memory controller, the third pulse having the boosted second edge to a word line coupled to a set of memory cells. The third pulse may have a pulse width based on the second pulse at the tracking bit line.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a set of memory cells coupled to a word line;
   a tracking cell coupled to a tracking word line and a tracking bit line;
   a tracking booster circuit coupled to the tracking word line, the tracking booster circuit configured to boost a first edge of a first pulse applied to the tracking word line thereby causing the first edge to become sharper, the tracking cell configured to generate a second pulse at the tracking bit line, in response to the first pulse having the boosted first edge; and
   a word line controller configured to apply a third pulse to the word line, based on the second pulse.

2. The memory device of claim 1, further comprising:
   a booster circuit coupled to the set of memory cells, the booster circuit to boost a second edge of the third pulse applied to the word line.

3. The memory device of claim 1, wherein the tracking booster circuit is to selectively boost the first edge of the first pulse, in response to a control signal having a first state.

4. The memory device of claim 1, wherein the tracking cell is to generate a second edge of the second pulse at the tracking bit line, in response to the boosted first edge of the first pulse.

5. The memory device of claim 4, wherein the word line controller is to apply a third edge of the third pulse to the word line, based on the second edge of the second pulse.

6. The memory device of claim 5,
   wherein the first edge is a rising edge of the first pulse,
   wherein the second edge is a falling edge of the second pulse, and
   wherein the third edge is a falling edge of the third pulse.

7. The memory device of claim 1, wherein the tracking booster circuit includes:
   a NAND gate including a first input port coupled to the tracking word line; and
   a transistor including:

a gate electrode coupled to an output port of the NAND gate, and a drain electrode coupled to the tracking word line.

8. The memory device of claim 7, wherein the NAND gate includes a second input port to receive a control signal to enable or disable the tracking booster circuit.

9. The memory device of claim 7, wherein the transistor is a P-type transistor.

10. A memory device comprising:
a memory array including:
  a first set of memory cells coupled to a bit line, at least one of the first set of memory cells coupled to a first word line, and
  a second set of memory cells coupled to a second word line, wherein the second set of memory cells has a larger number of memory cells than the first set of memory cells;
a first booster circuit coupled to the first word line, the first booster circuit configured to boost a first edge of a first pulse applied to the first word line thereby causing the first edge of the first pulse to become sharper, the at least one of the first set of memory cells configured to generate a second pulse at the bit line, in response to the first pulse having the boosted first edge;
a word line controller configured to apply a third pulse to the second word line, based on the second pulse; and
a second booster circuit coupled to the second word line, the second booster circuit configured to boost a second edge of the third pulse applied to the second word line thereby causing the second edge of the third pulse to become sharper.

11. The memory device of claim 10, wherein the at least one of the first set of memory cells is to generate a third edge of the second pulse at the bit line, in response to the boosted first edge of the first pulse.

12. The memory device of claim 11, wherein the word line controller is to apply a fourth edge of the third pulse subsequent to the second edge, based on the third edge of the second pulse.

13. The memory device of claim 12,
wherein the first edge is a rising edge of the first pulse,
wherein the second edge is a rising edge of the third pulse,
wherein the third edge is a falling edge of the second pulse, and
wherein the fourth edge is a falling edge of the third pulse.

14. A method comprising:
generating, by a memory controller, a first pulse having a first edge;
boosting, by the memory controller, the first edge of the first pulse thereby causing the first edge of the first pulse to become sharper;
applying, by the memory controller, the first pulse having the boosted first edge to a tracking word line coupled to a tracking cell, the tracking cell to generate a second pulse at a tracking bit line coupled to the tracking cell, responsive to the first pulse having the boosted first edge;
generating, by the memory controller, a third pulse;
boosting, by the memory controller, a second edge of the third pulse thereby causing the second edge of the third pulse to become sharper; and
applying, by the memory controller, the third pulse having the boosted second edge to a word line coupled to a set of memory cells, the third pulse having a pulse width based on the second pulse at the tracking bit line.

15. The method of claim 14,
wherein the tracking cell is to generate a third edge of the second pulse at the tracking bit line, in response to the boosted first edge of the first pulse, and
wherein generating, by the memory controller, the third pulse based on the second pulse at the tracking bit line includes generating, by the memory controller, a fourth edge of the third pulse subsequent to the second edge of the third pulse, based on the third edge of the second pulse.

16. The memory device of claim 14, further comprising a tracking booster circuit.

17. The memory device of claim 16, wherein the tracking booster circuit comprises a NAND gate including a first input port coupled to a tracking word line.

18. The memory device of claim 17, wherein the tracking booster circuit further comprises a transistor coupled to the NAND gate.

19. The memory device of claim 18, wherein the transistor comprises a gate electrode coupled to an output port of the NAND gate.

20. The memory device of claim 19, wherein the transistor further comprises a drain electrode coupled to the tracking word line.

* * * * *